(12) United States Patent
Park et al.

(10) Patent No.: US 8,472,505 B2
(45) Date of Patent: Jun. 25, 2013

(54) CONSTANT AMPLITUDE ENCODING APPARATUS AND METHOD FOR CODE DIVISION MULTIPLEXING COMMUNICATION SYSTEM

(75) Inventors: Tae Joon Park, Daejeon (KR); Wun Cheol Jeong, Daejeon (KR); Kyo Hoon Son, Daejeon (KR); Ho Yong Kang, Daejeon (KR); Seong Soon Joo, Daejeon (KR); Jong Suk Chae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 323 days.

(21) Appl. No.: 12/816,942

(22) Filed: Jun. 16, 2010

(65) Prior Publication Data
US 2010/0322289 A1  Dec. 23, 2010

(30) Foreign Application Priority Data

Jun. 17, 2009 (KR) .......... 10-2009-0053794
Sep. 25, 2009 (KR) .......... 10-2009-0091356
Dec. 29, 2009 (KR) .......... 10-2009-0132808
Jan. 22, 2010 (KR) .......... 10-2010-0006155
Jun. 15, 2010 (KR) .......... 10-2010-0056344

(51) Int. Cl.
*H04B 1/00* (2006.01)
(52) U.S. Cl.
USPC ........ 375/146; 375/130; 375/140; 375/141; 375/219; 375/220; 375/295; 370/320; 370/335; 370/342; 370/441; 370/479; 455/39; 455/73; 455/91

(58) Field of Classification Search
USPC .............. 375/130, 140, 141, 146, 219, 220, 375/295; 370/320, 335, 342, 441, 479; 455/39, 455/73, 91
See application file for complete search history.

(56) References Cited

U.S. PATENT DOCUMENTS

2003/0106008 A1* 6/2003 Butler et al. ............ 714/752
2004/0146116 A1* 7/2004 Kang et al. ............. 375/260
2005/0018705 A1* 1/2005 Ohsuge ................... 370/441

FOREIGN PATENT DOCUMENTS

KR  2003-0081779  10/2003
KR  10-2005-0022450  3/2005

* cited by examiner

*Primary Examiner* — Leon Flores
(74) *Attorney, Agent, or Firm* — Staas & Halsey LLP

(57) ABSTRACT

Disclosed are an apparatus and method for constant amplitude encoding of a transmission signal in a CDM (Code Division Multiplexing) communication system. The apparatus for constant amplitude encoding of a transmission signal includes: an encoding module sequentially performing horizontal encoding and vertical encoding on an input signal; and a spreading and multiplexing module spreading the signal which has been encoded by the encoding module and multiplexing the spread signal in a vertical direction to output a data stream having a constant amplitude.

15 Claims, 2 Drawing Sheets

CONSTANT AMPLITUDE ENCODING APPARATUS AND METHOD FOR CODE DIVISION MULTIPLEXING COMMUNICATION SYSTEM

CROSS-REFERENCE TO RELATED APPLICATIONS

This application claims the priorities of Korean Patent Application Nos. 10-2009-0053794 filed on Jun. 17, 2009, 10-2009-0091356 filed on Sep. 25, 2009, 10-2009-0132808 filed on Dec. 29, 2009, 10-2010-0006155 filed on Jan. 22, 2010 and 10-2010-0056344 filed on Jun. 15, 2010, in the Korean Intellectual Property Office, the disclosures of which are incorporated herein by reference.

BACKGROUND OF THE INVENTION

1. Field of the Invention

The present invention relates to a technique of selecting codes suitable for constant amplitude multiplexing and preventing extra information from being added for constant amplitude multiplexing through a combination of the selected codes to thereby prevent a reduction in transmission efficiency due to multiplexing in a CDM (Code Division Multiplexing) communication system using a frequency spreading scheme to improve a transfer rate in a limited frequency band.

2. Description of the Related Art

Conventionally, in order to adjust a multi-level signal generated by adding several orthogonal codes such that it has a constant amplitude of a uniform amplitude, a method of limiting a signal to have a certain level by using a level clipping has been used. This method is simple but has shortcomings in that the orthogonality of the orthogonal codes may be damaged, thereby bringing about information loss. Thus, this method can be applicable to voice or multimedia communications insensitive to an error without causing a problem, while being unsuitable for data communications sensitive to a loss of data therein.

In addition, a method for modulating data by selecting one of orthogonal codes allocated by blocks by using transmission data has been proposed. This method, however, is disadvantageous in that it cannot implement various spread coefficients.

Also, a method for performing constant amplitude conversion by using a Hadamard matrix has been also proposed. In this method, however, when an orthogonal code having a large spread coefficient, a repeated operation must be performed by layers in order to increase the spread coefficient, and in this case, in order to prevent modulation signals generated when orthogonal codes outputted from respective layers are added from becoming multi-level signals, extra information must be included. Thus, for example, if a spread coefficient is 16 at every spreading, only nine chips of user data is included over a 16-chip output, obtaining an efficiency of 9/16. Namely, this method has reduced transmission efficiency.

SUMMARY OF THE INVENTION

An aspect of the present invention provides an apparatus and method for constant amplitude encoding of transmission signal in a CDM (Code. Division Multiplexing) communication system that improves transmission characteristics by increasing a spread coefficient in a limited frequency band, capable of selecting a code suitable for a spread coefficient, performing vertical axis encoding on horizontal axis information by the selected code, and performing multiplexing thereon, thus performing a constant amplitude multiplexing process to increase the spread coefficient, in order to thereby prevent extra information from being added and prevent a reduction in transmission efficiency due to multiplexing.

According to an aspect of the present invention, there is provided an apparatus for constant amplitude encoding of a transmission signal, including: an encoding module sequentially performing horizontal encoding and vertical encoding on an input signal; and a spreading and multiplexing module spreading the signal which has been encoded by the encoding module and multiplexing the spread signal in a vertical direction to output a data stream having a constant amplitude.

According to another aspect of the present invention, there is provided a method for constant amplitude encoding of a transmission signal, the method including: sequentially performing encoding on an input signal in a horizontal direction and in a vertical direction; and spreading the encoded signal and multiplexing the spread signal in a vertical direction to output a data stream having a constant amplitude.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
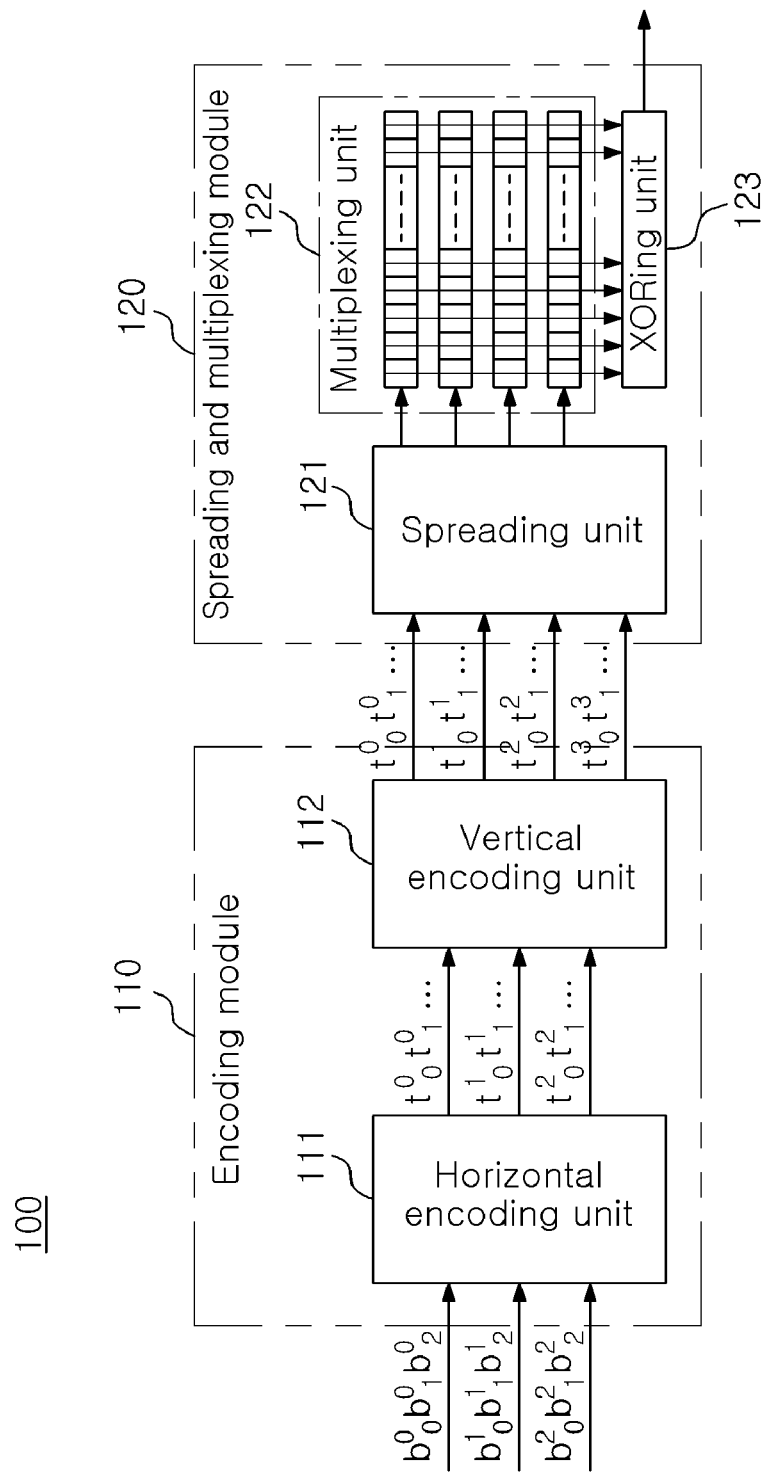
FIG. 1 is a schematic block diagram of an apparatus for constant amplitude encoding of a transmission signal in a CDM (Code Division Multiplexing) communication system according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In describing the present invention, if a detailed explanation for a related known function or construction is considered to unnecessarily divert from the gist of the present invention, such explanation will be omitted but would be understood by those skilled in the art. In the drawings, the shapes and dimensions may be exaggerated for clarity, and the same reference numerals will be used throughout to designate the same or like components.

It will be understood that when an element is referred to as being "connected with" another element, it can be directly connected with the other element or intervening elements may also be present. In contrast, when an element is referred to as being "directly connected with" another element, there are no intervening elements present. In addition, unless explicitly described to the contrary, the word "comprise" and variations such as "comprises" or "comprising," will be understood to imply the inclusion of stated elements but not the exclusion of any other elements.

FIG. 1 is a schematic block diagram of an apparatus for constant amplitude encoding of a transmission signal in a CDM (Code Division Multiplexing) communication system according to an exemplary embodiment of the present invention.

With reference to FIG. 1, a constant amplitude encoding apparatus 100 according to an exemplary embodiment of the present invention includes an encoding module 110 for sequentially performing horizontal encoding and vertical encoding on an input signal, and, a spreading and multiplexing module 120 spreading the signal which has been encoded by the encoding module 110, and multiplexing the spread signal in a vertical direction to output a final data stream having a constant amplitude.

The encoding module 110 may include a horizontal encoding unit 111 and a vertical encoding unit 112 and perform horizontal encoding and vertical encoding on the input signal according to a TPC (Turbo Product Code) encoding scheme.

Here, the TPC encoding refers to a two-dimensional product code represented such as [n,k]×[4,m] in which n is the number of bits to be encoded in a horizontal direction, k is the number of bits of information to be encoded, and m is a value for determining vertical encoding, which is determined according to a minimum Hamming distance and a spread coefficient. In the following exemplary embodiment, a case in which [16,9] CDM employing [4,3]×[4,3] TPC and a case in which [8,4]×[4,m] TPC (m=1, 2, 3) are employed will be described.

Employment of [4,3]×[4,3] TPC

Bit stream information inputted to the encoding module 110 for its TPC encoding may be converted into, for example, three horizontal input 3-bit streams. For example, of the input bit streams, the least significant three bits ($b_0$, $b_1$, $b_2$) may be converted into a first bit stream ($b^0_0$, $b^0_1$, $b^0_2$), the next three bits ($b_3$, $b_4$, $b_5$) may be converted into a second bit stream ($b^1_0$, $b^1_1$, $b^1_2$), and the last three bits ($b_6$, $b_7$, $b_8$) may be converted into a third bit stream ($b^2_0$, $b^2_1$, $b^2_2$) so as to be inputted to the encoding module 110. In this case, $b^2_2$ is a parity bit regarding byte information calculated according to Equation 1 shown below, which can be used for an iterative decoding of TPC at a reception side.

$$p = b^0_0 \oplus b^1_0 \oplus b^2_0 \oplus b^0_1 \oplus b^1_1 \oplus b^2_1 \oplus b^0_2 \oplus b^1_2 \quad \text{[Equation 1]}$$

The method for converting the input bit stream into three horizontal input 3-bit streams as described above is merely illustrative and the conversion method may vary as necessary.

A detailed configuration of the encoding module 110 will now be described. The horizontal encoding unit 111 may use a Hadamard code to perform horizontal TPC encoding on the input signal, and in addition, the horizontal encoding unit 111 may also use a certain code as well as the Hadamard code. For example, when the horizontal encoding unit 111 uses a [n,3] Hadamard code, the horizontal encoding unit 111 encodes a 3-bit input into n-bit information. Here, n is a certain integer and in the present exemplary embodiment, a case in which n is 4 will be described, but without being limited thereto, n may be 8, 16, 32, and so on.

In more detail, the horizontal encoding unit 111 converts the received three parallel bit streams ($b^x_0$, $b^x_1$, $b^x_2$: x=0, 1, 2) into three parallel n-bit streams ($t^x_0$, $t^x_1$, $t^x_2$, $t^x_3$, ..., $t^x_{n-1}$: x=0, 1, 2) by using the [n,3] Hadamard code. In this case, the [n,3] Hadamard code set is given as [$h_0$; $h_1$; $h_2$; $h_3$; $\bar{h}_3$; $\bar{h}_2$; $\bar{h}_1$; $\bar{h}_0$], in which and $h_i$ and $\bar{h}_i$ indicate an ith row of n×n Hadamard matrix and an inverted bit of $h_i$, respectively.

For example, when n is 4, a [4,3] Hadamard code set is obtained from a (4×4) Hadamard matrix as represented by Equation 2 below, and it can be expressed as shown in Table 1 below:

$$\bar{H}(4) = \begin{bmatrix} 0 & 0 & 0 & 0 \\ 0 & 1 & 0 & 1 \\ 0 & 0 & 1 & 1 \\ 0 & 1 & 1 & 0 \end{bmatrix} \quad \text{[Equation 2]}$$

TABLE 1

| Information bit ($b^x_0$, $b^x_1$, $b^x_2$: x = 0, 1, 2) | Codeword ($t^x_0$, $t^x_1$, $t^x_2$, $t^x_3$: x = 0, 1, 2) |
|---|---|
| 000 | 0000 |
| 001 | 0101 |
| 010 | 0011 |
| 011 | 0110 |
| 100 | 1001 |
| 101 | 1100 |
| 110 | 1010 |
| 111 | 1111 |

Thereafter, the vertical encoding unit 112 receives the signal which has been encoded by the horizontal encoding unit 111 and performs vertical TPC encoding thereupon. In this case, the vertical encoding unit 112 may use a [4,3] odd parity code.

In detail, the vertical encoding unit 112 adds one n-bit parity stream ($t^3_x$: x=0, 1, ..., n−1) to the received three parallel n-bit streams ($t^0_x$, $t^1_x$, $t^2_x$: x=0, 1, ..., n−1).

For example, when n is 4, the vertical encoding unit 112 adds one odd parity stream ($t^3_x$: x=0, 1, 2, 3) to the three parallel 4-bit streams ($t^0_x$, $t^1_x$, $t^2_x$: x=0, 1, 2, 3) so as to be converted into four. 4-bit streams as represented by Equation 3 shown below. In this case, $t^3_x$ can be obtained by Equation 4 shown below:

$$T_{unit} = \begin{bmatrix} t^0_0 & t^0_1 & t^0_2 & t^0_3 \\ t^1_0 & t^1_1 & t^1_2 & t^1_3 \\ t^2_0 & t^2_1 & t^2_2 & t^2_3 \\ t^3_0 & t^3_1 & t^3_2 & t^3_3 \end{bmatrix} \quad \text{[Equation 3]}$$

$$t^3_0 = \overline{t^0_0 \oplus t^1_0 \oplus t^2_0}$$
$$t^3_1 = \overline{t^0_1 \oplus t^1_1 \oplus t^2_1}$$
$$t^3_2 = \overline{t^0_2 \oplus t^1_2 \oplus t^2_2}$$
$$t^3_3 = \overline{t^0_3 \oplus t^1_3 \oplus t^2_3}$$
$$\text{[Equation 4]}$$

Figure 2:
FIG. 2 illustrates a two-dimensional (2D) data structure obtained by converting input information into a codeword matrix by an encoding module illustrated In FIG. 1.

As described above, when the input signal is converted into the [4,3]×[4,3] TPC codeword matrix by the horizontal encoding unit 111 and the vertical encoding unit 112, a two-dimensional (4×4) data structure as shown in FIG. 2 is produced.

Meanwhile, the case in which n is 4 has been described, but when n is 8, 16, 32, and so on, TPC encoding results by the vertical encoding unit 112 may be produced as the combinations of $T_{unit}$ represented by Equation 3, as represented by Equation 5 shown below:

$$T_{[n<4]} = \begin{cases} [T_{unit}] & n=4 \\ [T_{unit}T_{unit}] & n=8 \\ [T_{unit}T_{unit}T_{unit}] & n=16 \\ [T_{unit}T_{unit}T_{unit}T_{unit}] & n=32 \end{cases} \quad \text{[Equation 5]}$$

Thereafter, the spreading and multiplexing module 120 spreads the signal which has been encoded by the encoding module 110 and vertically multiplexes the spread signal to output a final data stream having a constant amplitude. In this case, the spreading and multiplexing module 120 may include a spreading unit 121, a multiplexing unit 122, and an XORing unit 123.

The spreading unit 121 receives the encoded signal which has been encoded by the encoding module 110 and spreads the encoded signal according to a predetermined spread coefficient. For example, the spreading unit 121 may perform spreading on the signal in a horizontal direction by using a Hadamard spreader. For example, when n is 4, the spreading unit 121 may spread the received $T_{unit}$ by using $h_i$ according to Equation 6 shown below:

$$s^i = [t^i_0 \oplus h_i t^i_1 \oplus h_i t^i_2 \oplus h_i t^i_3 \oplus h_i], \ i=0,1,2,3 \quad \text{[Equation 6]}$$

Thereafter, in order to generate a single output bit stream, the multiplexing unit 122 vertically multiplexes $s^i$, the spreading result of the spreading unit 121, namely, performs XORing thereupon by bits in the vertical direction to generate a bit stream represented by Equation 7 shown below. For example, when n is 4, the multiplexing unit 122 generates 16 bit streams represented by Equation 8 shown below. In this case, although the plurality of bit streams are multiplexed into one due to the influence of the vertical encoding unit 112 and the spreading unit 121 by the Hadamard spreader, a constant amplitude can be maintained.

$$\bar{c}_j = ((s^0_j \& s^1_j)|(s^2_j \& s^3_j)), \ (0 \le j < 16) \quad \text{[Equation 7]}$$

$$\bar{c}_0 = ((t^0_0 \& t^1_0)|(t^2_0 \& t^3_0))$$

$$\bar{c}_1 = ((t^0_0 \& \overline{t^1_0})|(t^2_0 \& \overline{t^3_0}))$$

$$\bar{c}_2 = ((\overline{t^0_0} \& t^1_0)|(\overline{t^2_0} \& t^3_0))$$

$$\bar{c}_3 = ((\overline{t^0_0} \& \overline{t^1_0})|(\overline{t^2_0} \& \overline{t^3_0}))$$

$$\bar{c}_4 = ((t^0_1 \& t^1_1)|(t^2_1 \& t^3_1))$$

$$\bar{c}_5 = ((t^0_1 \& \overline{t^1_1})|(t^2_1 \& \overline{t^3_1}))$$

$$\bar{c}_6 = ((\overline{t^0_1} \& t^1_1)|(\overline{t^2_1} \& t^3_1))$$

$$\bar{c}_7 = ((\overline{t^0_1} \& \overline{t^1_1})|(\overline{t^2_1} \& \overline{t^3_1}))$$

$$\bar{c}_8 = ((t^0_2 \& t^1_2)|(t^2_2 \& t^3_2))$$

$$\bar{c}_9 = ((t^0_2 \& \overline{t^1_2})|(t^2_2 \& \overline{t^3_2}))$$

$$\bar{c}_{10} = ((\overline{t^0_2} \& t^1_2)|(\overline{t^2_2} \& t^3_2))$$

$$\bar{c}_{11} = ((\overline{t^0_2} \& \overline{t^1_2})|(\overline{t^2_2} \& \overline{t^3_2}))$$

$$\bar{c}_{12} = ((t^0_3 \& t^1_3)|(t^2_3 \& t^3_3))$$

$$\bar{c}_{13} = ((t^0_3 \& \overline{t^1_3})|(t^2_3 \& \overline{t^3_3}))$$

$$\bar{c}_{14} = ((\overline{t^0_3} \& t^1_3)|(\overline{t^2_3} \& t^3_3))$$

$$\bar{c}_{15} = ((\overline{t^0_3} \& \overline{t^1_3})|(\overline{t^2_3} \& \overline{t^3_3})) \quad \text{[Equation 8]}$$

Meanwhile, when n is not 4, the bit stream $\bar{c}_j$, which has been spread and multiplexed by the spreading unit 121 and the multiplexing unit 122, may be obtained by combining Equation 7 and Equation 8 as results obtained by spreading and multiplexing $T_{[n \times 4]}$ produced as combinations of $T_{unit}$.

The XORing unit 123 XORs the result which has been multiplexed by the multiplexing unit 122 and a covering code by bits for synchronization to generate a final output having a constant amplitude. In this case, the covering code is a previously agreed code between a transmission end and a reception end. Preferably, a certain code having the same length as that of the bit stream $\bar{c}_j$ which has been spread and multiplexed by the spreading unit 121 and the multiplexing unit 122 and good correlation characteristics are used as the covering code. For example, when n is 4, 8, 16, and 32, the lengths of the covering code and final outputs by the XORing unit 123 are 16, 32, 64, and 128 bits, respectively.

Also, the final output data stream $c_0 \sim c_{4n-1}$ (n=4, 8, 16, 32) having a constant amplitude by the XORing unit 123 can be generated by using the output $\bar{c}_j$ of the multiplexing unit 122 and a covering code $m_i$, as represented by Equation 9 shown below:

$$c_i = \bar{c}_{(i \bmod 4) + floor(1/n) \times 4)} \oplus m_i, \ (0 \le i < 4n) \quad \text{[Equation 9]}$$

In this case, a floor function with respect to a real number x, i.e., floor(x), indicates the greatest integer value of x or smaller.

Employment of [8,3]×[4,3] TPC

In this case, the horizontal encoding unit 111 uses an [8,4] Hadamard code, while the vertical encoding unit 112 uses the [4,3] odd parity code such as that of the case of the employment of a [4,3]×[4,3] TPC.

Also, the spreading and multiplexing module 120 can be implemented in the same manner as that of the case of the employment of the foregoing [4,3]×[4,3] TPC.

Employment of [8,4]×[4,2] TPC

In this case, the horizontal encoding unit 111 uses an [8,4] Hadamard code, and the vertical encoding unit 112 uses a [4,2] code as shown in Table 2 below. In Table 2, c0 and c1 are the same as an input bit b0, c2 is the same as an input bit b1, and c3 is the same as an input bit ~b1, and c3 is an odd parity value.

TABLE 2

| Input bit (b0 b1) | Chip value (c0 c1 c2 c3) |
|---|---|
| 00 | 0001 |
| 01 | 0010 |
| 10 | 1101 |
| 11 | 1110 |

Also, the spreading and multiplexing module 120 can be implemented in the same manner as that of the case of the employment of the foregoing [4,3]×[4,3] TPC.

Employment of [8,4]×[4,1] TPC

In this case, the horizontal encoding unit 111 uses an [8,4] Hadamard code, and the vertical encoding unit 112 uses a [4,1] code as shown in Table 3 below.

TABLE 3

| Input bit (b0) | Chip value (c0 c1 c2 c3) |
|---|---|
| 0 | 1011 |
| 1 | 0100 |

Also, the spreading and multiplexing module 120 can be implemented in the same manner as that of the case employing the foregoing [4,3]×[4,3] TPC.

As set forth above, according to exemplary embodiments of the invention, the encoding module does not need to use an orthogonal code, achieving good flexibility.

In addition, compared with the related art in which, when a larger spread coefficient is required, extra information must be repeatedly added to maintain the constant amplitude, degrading transmission efficiency, and, in an exemplary embodiment of the present invention, extra information is added to convert a constant amplitude, irrespective of determining of a spread coefficient, thus achieving a transmission efficiency of three-fourths of a spread signal.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for constant amplitude encoding of a transmission signal, the apparatus comprising: an encoding module sequentially performing horizontal encoding and vertical encoding on an input signal, wherein the encoding module includes: a horizontal encoding unit performing horizontal encoding on the input signal by using a certain [n,k] code; and a vertical encoding unit receiving the signal which has been encoded by the horizontal encoding unit and performing vertical encoding on the received signal by using a [4,m] odd parity code, n being the number of bits to be encoded in a horizontal direction, k being the number of bits of information to be encoded, and m being a value for determining the horizontal encoding; and a spreading and multiplexing module for spreading the signal which has been encoded by the encoding module and multiplexing the spread signal in a vertical direction to output a data stream having a constant amplitude, wherein the encoding module and the spreading and multiplexing module are incorporated in one or more processors.

2. The apparatus of claim 1, wherein the encoding module performs the horizontal and vertical encoding on the input signal according to a TPC (Turbo Product Code) encoding scheme.

3. The apparatus of claim 2, wherein the certain [n,k] code is an [n,k] Hadamard code.

4. The apparatus of claim 3, wherein when the horizontal encoding unit uses an [n,3] Hadamard code, the horizontal encoding unit converts the received three parallel bit streams ($b^x_0$, $b^x_1$, $b^x_2$: x=0, 1, 2) into three parallel n-bit streams ($t^x_0$, $t^x_1$, $t^x_2$, $t^x_3$, ..., $t^x_{n-1}$: x=0, 1, 2).

5. The apparatus of claim 4, wherein the the [n,3] Hadamard code set is [$h_0$; $h_1$; $h_2$; $h_3$; $\bar{h}_3$; $\bar{h}_2$; $\bar{h}_1$; $\bar{h}_0$], in which $h_i$ indicates an ith row of n×n Hadamard matrix and $\bar{h}_i$ is an inverted bit of $h_i$.

6. The apparatus of claim 4, wherein when the vertical encoding unit uses a [4,3] odd parity code, the vertical encoding unit adds one n-bit parity stream ($t^3_x$: x=0, 1, ..., n-1) to the received three parallel n-bit streams ($t^0_x$, $t^1_x$, $t^2_x$: x=0, 1, ..., n-1).

7. The apparatus of claim 1, wherein the spreading and multiplexing module comprises:
a spreading unit receiving the signal which has been encoded by the encoding module and spreading the received signal according to a predetermined spreading coefficient;
a multiplexing unit multiplexing the signal, which has been spread by the spreading unit, in a vertical direction; and
an XORing unit XORing the signal, which has been multiplexed by the multiplexing unit, and a covering code by bits, and generating a final output having a constant amplitude.

8. The apparatus of claim 7, wherein the spreading unit performs spreading in a horizontal direction according to a required spread coefficient by using a Hadamard spreader.

9. The apparatus of claim 8, wherein the spreading unit receives a result represented by the equation shown below:

$$T_{unit} = \begin{bmatrix} t^0_0 & t^0_1 & t^0_2 & t^0_3 \\ t^1_0 & t^1_1 & t^1_2 & t^1_3 \\ t^2_0 & t^2_1 & t^2_2 & t^2_3 \\ t^3_0 & t^3_1 & t^3_2 & t^3_3 \end{bmatrix}$$

and performs spreading thereon according to the equation shown below:

$s^i = [t^i_0 \oplus h_i t^i_1 \oplus h_i t^i_2 \oplus h_i t^i_3 \oplus h_i]$, i=0, 1, 2, 3.

10. The apparatus of claim 9, wherein the multiplexing unit XORs the result $s^i$, which has been spread by the spreading unit, by bits in a vertical direction to generate to generate a bit stream represented by the equation shown below:

$\bar{c}_j = ((s^0_j \& s^1_j) | (s^2_j \& s^3_j))$, (0≤j<16).

11. The apparatus of claim 10, wherein a final output obtained by the XORing unit is represented by the equation shown below:

$c_i = \bar{c}_{((i \bmod 4) + floor(1/n) \times 4)} \oplus m_i$, (0≤i<4n)

wherein $m_i$ is a covering code.

12. A method for constant amplitude encoding of a transmission signal, the method comprising: sequentially performing encoding on an input signal in a horizontal direction and in a vertical direction, the encoding including: performing horizontal encoding on the input signal by using a certain [n,k] code; and receiving the horizontally encoded signal and performing vertical encoding on the received signal by using a [4,m] odd parity code, n being the number of bits to be encoded in a horizontal direction, k being the number of bits of information to be encoded, and m being a value for determining the horizontal encoding; and spreading the encoded signal and multiplexing the spread signal in a vertical direction to output a data stream having a constant amplitude, wherein the encoding, spreading, and multiplexing are performed by one or more processors.

13. The method of claim 12, wherein, in encoding the input signal, horizontal encoding and vertical encoding are performed on the input signal according to a TPC (Turbo Product Code) encoding scheme.

14. The method of claim 13, wherein the certain [n,k] code is an [n,k] Hadamard code.

15. The method of claim 12, wherein outputting of the data stream of the constant amplitude comprises:
spreading the encoded signal according to a predetermined spread coefficient;
multiplexing the spread signal in a vertical direction; and
XORing the multiplexed signal and a covering code by bits to generate a final output having a constant amplitude.

* * * * *